United States Patent
Yamazaki et al.

(10) Patent No.: US 8,786,280 B2
(45) Date of Patent: Jul. 22, 2014

(54) MAGNETO-RESISTANCE EFFECT ELEMENT AND SENSOR

(75) Inventors: Hiroshi Yamazaki, Tokyo (JP); Hiraku Hirabayashi, Tokyo (JP); Naoki Ohta, Tokyo (JP)

(73) Assignee: TDK Corporation, Tokyo (JP)

( * ) Notice: Subject to any disclaimer, the term of this patent is extended or adjusted under 35 U.S.C. 154(b) by 684 days.

(21) Appl. No.: 12/845,992

(22) Filed: Jul. 29, 2010

(65) Prior Publication Data

US 2011/0025322 A1 Feb. 3, 2011

(30) Foreign Application Priority Data

Jul. 31, 2009 (JP) ................................. 2009-179103

(51) Int. Cl.
*G01R 33/02* (2006.01)

(52) U.S. Cl.
USPC ............................ 324/252; 257/421; 257/427

(58) Field of Classification Search
USPC ...................... 324/252, 207.21; 257/421–428
See application file for complete search history.

(56) References Cited

U.S. PATENT DOCUMENTS

| | | | | |
|---|---|---|---|---|
| 5,561,368 | A * | 10/1996 | Dovek et al. | 324/252 |
| 6,114,056 | A * | 9/2000 | Inomata et al. | 428/811.1 |
| 7,095,596 | B2 * | 8/2006 | Schmollngruber et al. | 360/324 |
| 7,428,128 | B2 * | 9/2008 | Hasegawa et al. | 360/324.11 |
| 7,663,171 | B2 * | 2/2010 | Inokuchi et al. | 257/295 |
| 7,994,597 | B2 * | 8/2011 | Min | 257/421 |
| 2003/0006764 | A1 | 1/2003 | Kou | |
| 2007/0007609 | A1 * | 1/2007 | Saito et al. | 257/421 |
| 2008/0026253 | A1 * | 1/2008 | Yuasa et al. | 428/811 |
| 2008/0032158 | A1 * | 2/2008 | Sasaki | 428/811.2 |
| 2008/0032423 | A1 | 2/2008 | Wang et al. | |
| 2008/0100969 | A1 * | 5/2008 | Mizuno et al. | 360/314 |
| 2008/0116886 | A1 | 5/2008 | Yamada et al. | |
| 2008/0198515 | A1 * | 8/2008 | Miyauchi et al. | 360/324.11 |
| 2009/0161254 | A1 * | 6/2009 | Ishio et al. | 360/110 |

FOREIGN PATENT DOCUMENTS

| | | |
|---|---|---|
| EP | 1 544 580 A2 | 6/2005 |
| JP | B2-7-119619 | 12/1995 |
| JP | A-11-126933 | 5/1999 |
| JP | B2-3017061 | 12/1999 |
| JP | A-2001-102659 | 4/2001 |
| JP | A-2003-298145 | 10/2003 |
| JP | A-2005-180942 | 7/2005 |
| JP | A-2006-29792 | 2/2006 |
| JP | A-2008-039782 | 2/2008 |

OTHER PUBLICATIONS

Jan. 4, 2012 Office Action issued in Japanese Application No. 2010-169246 (with translation).
Kou, F. et al., "Development of Highly Sensitive Terrestrial Sensor using TMR Junctions," *Journal of the Magnetics Society of Japan*, 2008, pp. 361-365, vol. 32, No. 3.
Oct. 22, 2010 European Search Report issued in Application No. 10171143.0.

* cited by examiner

*Primary Examiner* — Tung X Nguyen
*Assistant Examiner* — Giovanni Astacio-Oquendo
(74) *Attorney, Agent, or Firm* — Oliff PLC

(57) ABSTRACT

A magneto-resistance effect element for a sensor to sense a variation in externally applied magnetism includes a pinned layer having a fixed magnetization direction, a free layer having a magnetization direction which varies in response to an external magnetic field, and an intermediate layer provided between the pinned layer and the free layer. The pinned layer has a planar shape which is long in the fixed magnetization direction and which is short in a direction orthogonal to the fixed magnetization direction. Moreover, the pinned layer preferably has a planar shape in which the pinned layer is divided into a plurality of sections.

15 Claims, 5 Drawing Sheets

● diameter of free layer: 0.6μm, diameter of pinned layer: 0.6μm
◆ diameter of free layer: 0.6μm, width of pinned layer: 2μm
■ diameter of free layer: 0.6μm, width of pinned layer: 1.2μm
▲ diameter of free layer: 1.2μm, width of pinned layer: 2μm

MAGNETO-RESISTANCE EFFECT ELEMENT AND SENSOR

BACKGROUND OF THE INVENTION

1. Field of the Invention

The present invention relates to a magneto-resistance effect element and a sensor.

2. Description of the Related Art

Sensors using magneto-resistance effect (MR) elements have sometimes been used to sense the angle of rotation of a steering wheel in a vehicle (see Japanese Patent Application Laid-open No. 2006-29792A, Japanese Patent Application Examined Publication No. 7-119619B, Japanese Patent No. 3017061, and "Development of Highly Sensitive Terrestrial Sensor using TMR Junctions", Kou, F. et al., Journal of the Magnetics Society of Japan Vol. 32, No. 3, 2008, published by The Magnetic Society of Japan). Specifically, the sensor is configured such that for example, a magnet is mounted on the shaft of the steering wheel and such that a sensing circuit including a Wheatstone bridge with a plurality of MR elements connected to each other is fixed at a position opposite to the magnet. When a driver turns the steering wheel, the magnet mounted on the shaft of the steering wheel is moved to change the position of the magnet relative to each of the MR elements forming the Wheatstone bridge. Then, a magnetic force exerted on each MR element by the magnet changes, and the change in magnetic force in tune changes the resistance value of each MR element. Thus, the sensor can operate as follows. The sensor senses the change in the resistance value of each MR element to determine the direction and amount of movement of the magnet. Based on the determined direction and amount, the sensor determines the direction in which and the angle by which the steering wheel has been turned. Then, based on the amount of rotation of the steering wheel sensed by such a sensor, a motor configured to assist in the movement of a steering axle is driven and is controlled. Thus, so-called power steering, which requires only a weak force, can be carried out.

Examples of an MR element include a CIP-GMR (Current in Plane-Giant Magneto-resistance effect) element, a CPP (Current Perpendicular to Plane)-GMR element, a TMR (Tunnel Magneto-resistance effect) element, and an AMR (Anisotropic Magneto-resistance effect) element; the CIP-GMR element is a giant magneto-resistance effect element including paired ferromagnetic layers and a nonmagnetic layer positioned between the ferromagnetic layers as an intermediate layer and in which a sense current flows parallel to the layers, the CPP-GMR element is a GMR element in which a sense current flows perpendicularly to the layers, the TMR element is a element including an insulating layer instead of the nonmagnetic layer as an intermediate layer and in which a sense current flows perpendicularly to the layers, and the AMR element utilizes an anisotropic magneto-resistance effect.

A general GMR element includes a pinned layer that is a ferromagnetic layer shaped like a pillar with a desired size and having a fixed magnetization direction, a free layer that is a ferromagnetic layer having a magnetization direction varied in response to external magnetic fields, and a nonmagnetic intermediate layer sandwiched between the pinned layer and the free layer. The general TMR element is configured such that an insulating intermediate layer (barrier layer) is sandwiched between the pinned layer and the free layer. Such an MR element is also called a spin valve film (SV film). A cap layer is provided at the upper end of the MR element. An underlying layer is provided at the lower end of the MR element. The MR element is sandwiched between an upper electrode layer and a lower electrode layer. In the CPP-GMR element and the TMR element, a sense current flows orthogonally to the layers. An example of the GMR element is disclosed in Japanese Patent Application Laid-open No. 11-126933A. An example of the TMR element is disclosed in Japanese Patent Application Laid-open No. 2001-102659A.

As described above, some sensors are configured as follows. A plurality of MR elements are connected to each other to form a Wheatstone bridge. A sensing circuit including the Wheatstone bridge is fixed at a position opposite to a magnet mounted on a sense target member (for example, the shaft of the steering wheel). The sensor measures a plurality of output voltages from the Wheatstone bridge. There has been a demand to make the sensing accuracy of the sensor as high as possible.

The following matters are obstacles to an increased sensing accuracy. The magnetization direction of the pinned layer slightly changes in response to external magnetic fields, and a variation is not sensitive in the magnetization direction in the free layer in response to external magnetic fields. That is, the pinned layer is desirably prevented, as originally intended, from being affected by external magnetic fields and from having its magnetization direction varied. The free layer desirably finely detects weak external magnetic fields so that the magnetization direction in the free layer can be varied, as originally planned.

SUMMARY OF THE INVENTION

An object of the present invention is to provide a magneto-resistance effect element configured to enable improvement in sensing accuracy by making the magnetization direction in the pinned layer more unlikely to vary, as well as a sensor that uses the magneto-resistance element.

A magneto-resistance effect element for a sensor to sense variation in externally applied magnetism according to the present invention includes a pinned layer having a fixed magnetization direction, a free layer having a magnetization direction which varies in response to an external magnetic field, and an intermediate layer provided between the pinned layer and the free layer, and the pinned layer has a planar shape which is long in the fixed magnetization direction and which is short in a direction orthogonal to the fixed magnetization direction.

Furthermore, another magneto-resistance effect element for a sensor includes a pinned layer having a fixed magnetization direction, a free layer having a magnetization direction which varies in response to an external magnetic field, and an intermediate layer provided between the pinned layer and the free layer, and the pinned layer has a planar shape in which the pinned layer is divided into a plurality of sections. Also in this configuration, it is preferred that each of the plurality of sections of the pinned layer has a planar shape which is long in the fixed magnetization direction and which is short in a direction orthogonal to the fixed magnetization direction.

The pinned layer preferably has a planar shape in which a length in the fixed magnetization direction is at least three times as large as a length in the direction orthogonal to the fixed magnetization direction. The free layer preferably has a circular planar shape.

The total area of the free layer as seen in a plan view is preferably larger than the area of a portion of the pinned layer which overlaps the free layer as seen in a plan view. In particular, preferably, the free layer is circular, and the total area of the free layer as seen in a plan view is larger than the total area of the pinned layer as seen in a plan view. The intermediate layer is an insulating layer in a TMR element and is a nonmagnetic layer in a GMR element. The intermediate layer may be an insulating and nonmagnetic layer.

A sensor according to the present invention includes a sensing circuit including a Wheatstone bridge with a plurality of magneto-resistance effect elements each having any one of the above-described configurations and connected to each other, and a magnet provided at a position opposite to the sensing circuit. By sensing a variation in the resistance value of each of the magneto-resistance effect elements resulting from a variation in magnetic force exerted on the free layer in the magneto-resistance effect element by the magnet, the sensor is capable of sensing a variation in a positional relationship between the magnet and the sensing circuit. The following configuration is possible. The magnet is mounted on a sense target member. The sensing circuit is fixed at a position opposite to the magnet. By sensing a variation in the resistance value of the magneto-resistance effect element, the sensor is capable of sensing a variation in the angle of the sense target member.

The present invention enables a reduction in the possibility that the magnetization direction in the pinned layer in the magneto-resistance effect element is varied under the effect of external magnetic fields. This enables a reduction in the magnitude of a sensor sensing error, thus increasing the accuracy of the sensor.

The above and other objects, features and advantages of the present invention will become apparent from the following description with reference to the accompanying drawings which illustrate examples of the present invention.

DESCRIPTION OF THE PREFERRED EMBODIMENTS

Embodiments of the present invention will be described below.

Figure 1:
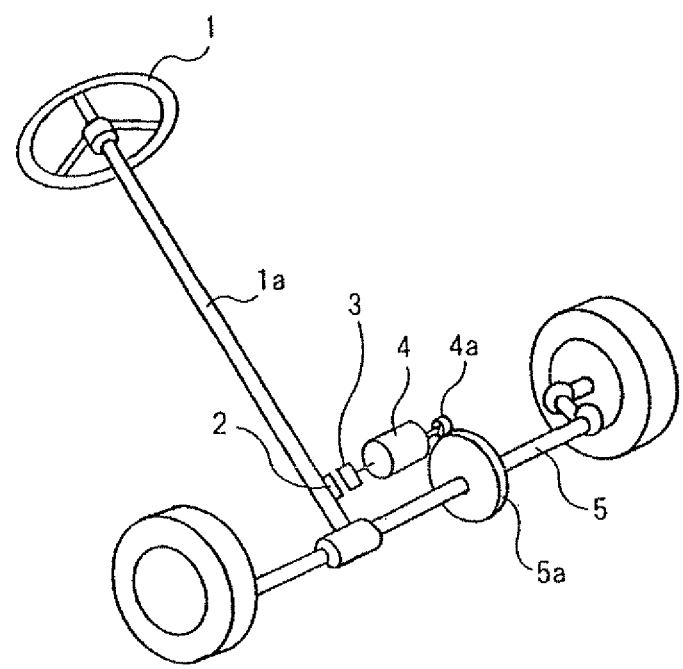
FIG. 1 is a schematic view showing an essential part of a vehicle in which a sensor according to the present invention is incorporated.

First, the general configuration of a sensor according to the present invention, that is, an example of a sensor configured to sense the angle of a sense target member, will be described. As schematically shown in FIG. 1, permanent magnet 2 is mounted on a part of shaft 1a of steering wheel 1 in a vehicle. At a position opposite to magnet 2, sensing circuit 3 is fixed to a mounting member (not shown in the drawings). Magnet 2 and sensing circuit 3 are the main components of the sensor. Sensing circuit 3 is connected to motor 4 via a control circuit (not shown in the drawings). Pinion 4a of motor 4 is coupled to gear 5a attached to steering axle 5. Steering axle 5 is coupled to shaft 1a of steering wheel 1.

Figure 2:
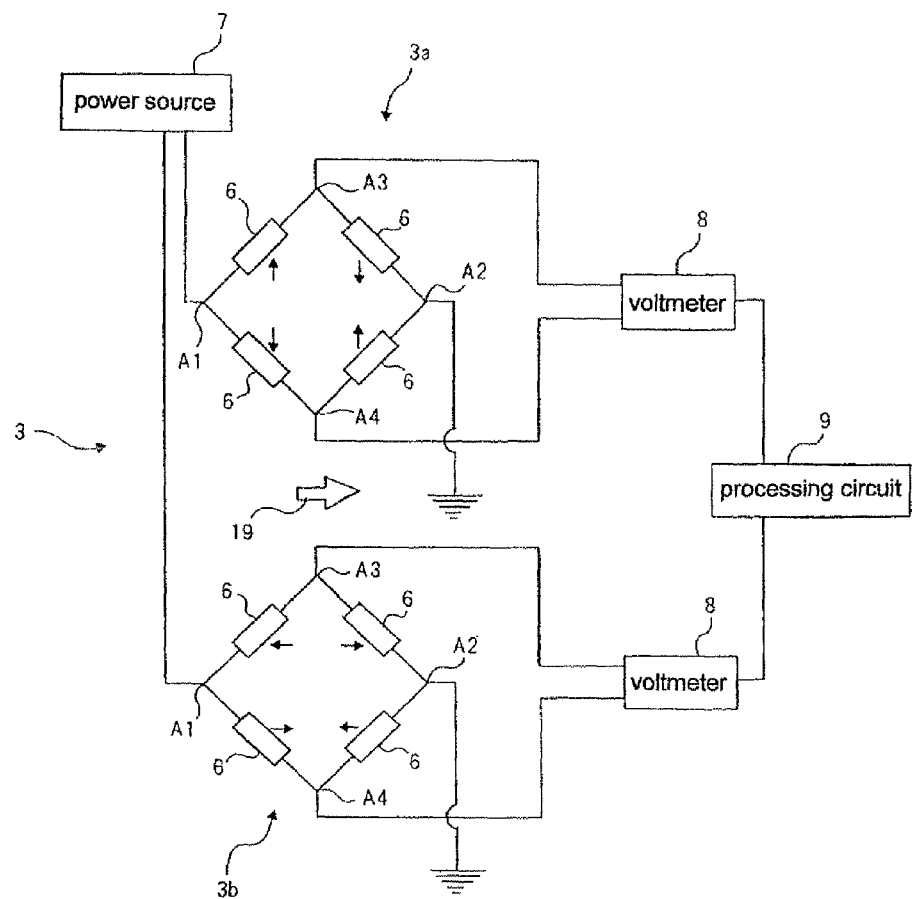
FIG. 2 is a block diagram showing a sensing circuit in the sensor according to the present invention.

The configuration of sensing circuit 3 is schematically shown in FIG. 2. Sense circuit 3 includes two Wheatstone bridges 3a and 3b. In the circuitry design shown in FIG. 2, each of Wheatstone bridges 3a and 3b includes four magneto-resistance effect elements (MR elements) 6 arranged at the respective four sides of a rectangle. Point A1 of the rectangle is connected to power source 7. Point A2 located opposite point A1 is grounded. Two points A3 and A4 are connected to voltmeter 8 to detect the difference in potential (hereinafter referred to as the "output voltage") between points A3 and A4. Based on the output voltage, processing circuit 9 senses a variation in the resistance value of each MR element 6. The above and below explanations of an arrangement of each element or the like relates to a layout in the circuitry design shown in FIG. 2. However, an actual mounting position of each element or the like on a substrate (not shown) is not limited by these explanations.

Figure 3:
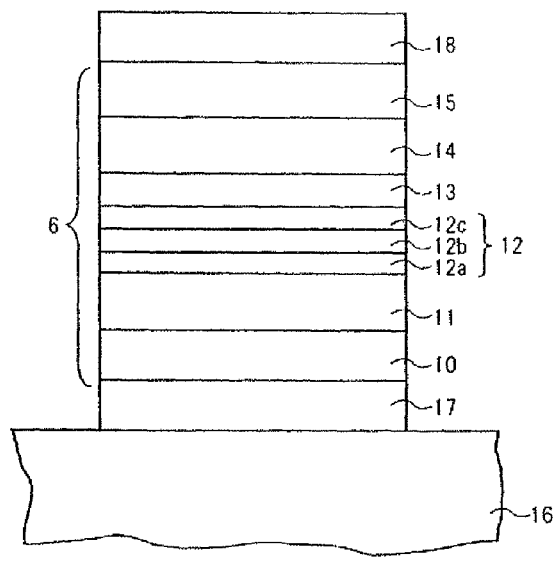
FIG. 3 is a sectional view schematically showing the structure of an MR element included in the sensing circuit shown in FIG. 2.

Now, the configuration of each of MR elements 6 in each of Wheatstone bridges 3a and 3b will be described. As shown in FIG. 3, MR element 6 is configured such that underlying layer 10, antiferromagnetic layer 11, pinned layer 12, intermediate layer 13, free layer 14, and cap layer 15 are stacked in this order. In the example shown in FIG. 3, pinned layer 12 is configured such that nonmagnetic layer 12b is sandwiched between outer layer 12a and inner layer 12c each of which is composed of a ferromagnetic substance. Outer layer 12a is provided in contact with antiferromagnetic layer 11. Inner layer 12c is provided in contact with intermediate layer 13. MR element 6 is sandwiched between lower electrode layer 17 and upper electrode layer 18 on substrate 16. A sense current is allowed to flow in a direction orthogonal to the above-described layers.

Table 1 shows an example of the material and thickness of each of the layers in MR element 6. However, the material and thickness of each layer are not limited to those shown in the following example and can be optionally changed. Furthermore, underlying layer 10, antiferromagnetic layer 11, and cap layer 15 may be appropriately omitted.

TABLE 1

| | | Material | Film thickness (nm) |
|---|---|---|---|
| Cap layer 15 | | Ta | 4 |
| Free layer 14 | | CoFe/NiFe | 1/3 |
| Intermediate layer 13 | | $Al_2O_3$ | 0.6 |
| Pinned layer 12 | Inner layer 12c | CoFe | 2.5 |
| | Nonmagnetic layer 12b | Ru | 0.8 |
| | Outer layer 12a | CoFe | 2 |

TABLE 1-continued

| Material | Film thickness (nm) |
|---|---|---|
| Antiferromagnetic layer 11 | IrMn | 7 |
| Underlying layer 10 | Ta/Ru | 1.5/2 |

The material of underlying layer 10 is selected to be a combination of materials serving to improve exchange coupling between antiferromagnetic layer 11 and outer layer 12a of pinned layer 12. Underlying layer 10 is composed of a stack film including, for example, a Ta film with a thickness of 1.5 nm and a Ru film with a thickness of 2 nm.

Antiferromagnetic layer 11 serves to fix the magnetization direction in pinned layer 12, and is composed of an IrMn film with a thickness of 7 nm, for example.

Pinned layer 12 is formed as a magnetic layer, and as described above, configured such that outer layer 12a, nonmagnetic layer 12b, and inner layer 12c are stacked in this order. In the present embodiment, outer layer 12a has its magnetization direction fixed with respect to external magnetic fields by antiferromagnetic layer 11. Outer layer 12a is formed of, for example, a CoFe film with a thickness of 2 nm. Nonmagnetic layer 12b is composed of, for example, a Ru film with a thickness of 0.8 nm. Inner layer 12c is composed of, for example, a CoFe film with a thickness of 2.5 nm. In pinned layer 12 (synthetic pinned layer) with the stack structure described above, the magnetic moment in outer layer 12a and the magnetic moment in inner layer 12c offset each other. Thus, leakage magnetic fields as a whole are suppressed, and the magnetization direction in inner layer 12c is firmly fixed. However, pinned layer 12 may have a single-layer structure. The present invention is mainly characterized by adopting a novel configuration and a novel shape for pinned layer 12. This will be described below.

Intermediate layer 13 is composed of, for example, an $Al_2O_3$ film with a thickness of 0.5 nm. In the present embodiment, MR element 6 is a TMR element configured to exert a tunnel magneto-resistance effect. Intermediate layer 13 is an insulating layer. However, MR element 6 according to the present invention is not limited to the TMR element but may be a GTR element. In the GTR element, a nonmagnetic layer is formed as intermediate layer 13.

In free layer 14, the magnetization direction varies in response to external magnetic fields. Free layer 14 according to the present embodiment is composed of a stack film including, for example, a CoFe film with a thickness of 1 nm and an NiFe film with a thickness of 3 nm.

Cap layer 15 is provided in order to prevent MR element 6 from being degraded. Cap layer 15 is composed of, for example, a Ta film with a thickness of 4 nm.

Lower electrode layer 17 and upper electrode layer 18 between which MR element 6 is sandwiched is composed of, for example, a Cu film.

In MR element 6, the resistance value varies depending on the relationship of the magnetization direction in free layer 14, which varies in response to external magnetic fields, relative to the fixed magnetization direction in pinned layer 12. In each of Wheatstone bridges 3a and 3b in sensing circuit 3, pinned layers 12 in MR elements 6 positioned on the respective adjacent sides of the rectangle in the circuitry design shown in FIG. 2 have opposite magnetization directions. Pinned layers 12 in MR elements 6 located opposite each other across the center of the rectangle in the circuitry design shown in FIG. 2 have the same magnetization direction.

These magnetization directions are shown by arrows in FIG. 2. There is 90° of rotation between the magnetization direction in pinned layer 12 in MR element 6 located at each of the four positions in Wheatstone bridge 3a and the magnetization direction in pinned layer 12 in MR element 6 located at the corresponding position in the Wheatstone bridge 3b.

In this configuration, for example, as shown in the drawings, if external magnetic field 19 facing rightward in FIG. 2 is applied to sensing circuit 3, the resistances of four MR elements 6 in Wheatstone bridge 3a are all equal. Thus, the output voltage from Wheatstone bridge 3a is zero. On the other hand, the resistances of four MR elements 6 in Wheatstone bridge 3b are maximized or minimized. Thus, the output voltage from Wheatstone bridge 3b has a maximum value. The output voltages from both Wheatstone bridges 3a and 3b vary in conjunction with a variation in the direction of external magnetic field 19 shown by an arrow (for example, the direction varies counterclockwise). Although not shown in the drawings, a variation in output voltage with respect to a variation in the angle of external magnetic field 19 is expressed in a graph as a sine curve for Wheatstone bridge 3a and as a cosine curve for Wheatstone bridge 3b. Thus, measurement of the output voltages from both Wheatstone bridges 3a and 3b allows the direction (angle) of external magnetic field 19 to be determined. Hence, based on the direction of external magnetic field 19, the position (angle of rotation) of magnet 2 (see FIG. 1) relative to each MR element 6 in sensing circuit 3 can be determined.

As described above, sensing circuit 3 and magnet 2 form an angle sensor. Specifically, as shown in FIG. 1, when a driver turns steering wheel 1, magnet 2 mounted on shaft 1a is moved. This changes the direction of magnetic field 19 applied by magnet 2 to free layer 14 in each of MR elements 6 in each of Wheatstone bridges 3a and 3b in sensing circuit 3. This in turn changes the resistance value of each MR element 6 and thus the output voltages from both Wheatstone bridges 3a and 3b change. Voltmeter 8 detects the changes in the output voltages from both Wheatstone bridges 3a and 3b. Processing circuit 9 then performs an arithmetic operation to determine the position of magnet 2. Thus, the angle of rotation of steering wheel 1 is determined. Then, in accordance with the angle of rotation, motor 4 is actuated to rotate steering axle 5 via pinion 4a and gear 5a. The rotation of axle 5 by motor 4 assists in the steering resulting from the turning of steering wheel 1 by the user. As a result, so-called power steering, which requires only a weak force, is realized.

In connection with the sensor including MR elements 6 as described above, the inventors focused on one conventional factor preventing accuracy from being improved, that is, a variation in the magnetization direction in pinned layer 12 caused by external magnetic fields. The sensing by the above-described sensor including MR elements 6 is based on the relationship of the magnetization direction in free layer 14, which is varied by external magnetic field 19, relative to the fixed magnetization direction in pinned layer 12. Thus, even with a slight change in the magnetization direction in pinned layer 12 in response to the external magnetic field as in the case of the magnetization direction in free layer 14, the sensing accuracy decreases significantly. Thus, the inventor adopted the following configuration in order to prevent the magnetization direction in pinned layer 12 from varying under the effect of the external magnetic field.

Figure 4:
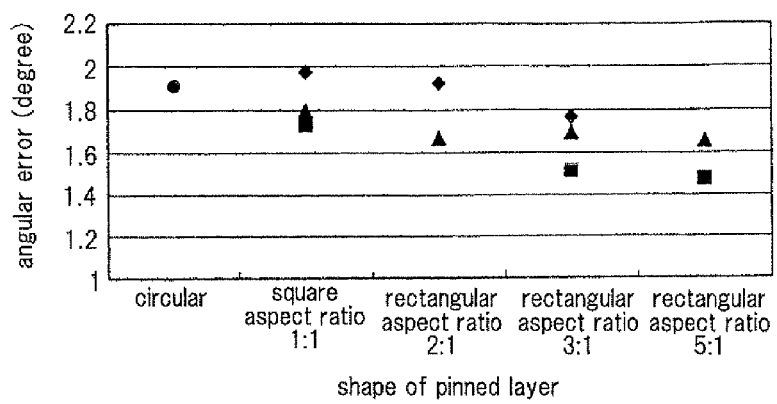
FIG. 4 is a graph showing the relationship between an angular error and the shape of a pinned layer in the MR element included in the sensing circuit in the sensor.
Figure 5:
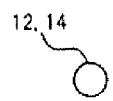
FIG. 5 is a plan view showing an example of the shapes of the pinned layer and a free layer in the MR element included in the sensing circuit in the sensor.

The inventor focused on the planar shape of pinned layer 12 in connection with measures for making the magnetization direction in pinned layer 12 unlikely to vary. The inventor thus found that the magnetization direction in pinned layer 12 is unlikely to vary when pinned layer 12 has an elongate planar shape which is long in the desired magnetization direction and which is short in a direction orthogonal to the desired magnetization direction. To demonstrate this, the inventor produced various MR elements 6 and constructed sensing circuit 3 including Wheatstone bridges 3a and 3b. Then, the inventor measured the angle of sensing circuit 3 relative to opposite magnet 2. The inventor thus compared the measured result with the sensing result obtained by sensing circuit 3 to determine an angular error. The results are shown in FIG. 4. At the time of the measurement, external magnetic field 19 was 300 Oe (about 23,900 A/m).

In the description below, the following is assumed. When the shape of pinned layer 12 is referred to, outer layer 12a, nonmagnetic layer 12b, and inner layer 12c are all formed to have the same shape. Moreover, although not described in detail, the layers in contact with pinned layer 12 may be partly formed to have a similar shape. FIGS. 5, 6A-6C, 7A-7C, 8A-8D, 10, and 11 show only pinned layer 12 and free layer 14, included in MR element 6, so as to be easily viewable. All the other layers in MR element 6 are omitted from these figures.

First, free layer 14 in each MR element 6 was formed so as to have a circular planar shape with a diameter of 0.6 μm. Insulating intermediate layer 13 was formed to have substantially the same shape as that of free layer 14. Then, pinned layer 12 located opposite to free layer 14 via intermediate layer 13 was formed to have a circular planar shape with a diameter of 0.6 μm (see FIG. 5). Then, an angular error resulting from this planar shape was determined and plotted as a circular dot as shown in FIG. 4.

Then, with free layer 14 and intermediate layer 13 formed to have a circular planar shape with a diameter of 0.6 μm as in the case of the above-described example, pinned layer 12 was formed to have a square planar shape that was 2 μm in both width and length (the aspect ratio is 1:1; see FIG. 6A), and an angular error resulting from this planar shape was determined. Furthermore, pinned layer 12 was formed to have a rectangular planar shape that was 2 μm in width and 4 μm in length (the aspect ratio is 2:1; see FIG. 6B), and an angular error resulting from this planar shape was determined. Moreover, pinned layer 12 was formed to have a rectangular planar shape that was 2 μm in width and 6 μm in length (the aspect ratio is 3:1; see FIG. 6C), and an angular error resulting from this planar shape was determined. The determined angular errors were plotted as rhombic dots as shown in FIG. 4. In the example shown in FIG. 6A to FIG. 6C, the ratio of the diameter of free layer 14 to the width of pinned layer 12 is 0.6 to 2, that is, 1 to about 3.3.

Furthermore, with the planar shapes of free layer 14 and intermediate layer 13 unchanged, pinned layer 12 was formed to have a square planar shape that was 1.2 μm in both width and length (the aspect ratio is 1:1; see FIG. 7A), and an angular error resulting from this planar shape was determined. Furthermore, pinned layer 12 was formed to have a rectangular planar shape that was 1.2 μm in width and 3.6 μm in length (the aspect ratio is 3:1; see FIG. 7B), and an angular error resulting from this planar shape was determined. Moreover, pinned layer 12 was formed to have a rectangular planar shape that was 1.2 μm in width and 6 μm in length (the aspect ratio is 5:1; see FIG. 7C), and an angular error resulting from this planar shape was determined. The determined angular errors were plotted as rectangular dots as shown in FIG. 4. In this case, the ratio of the diameter of free layer 14 to the width of pinned layer 12 is 0.6 to 1.2, that is, 1 to 2.

Moreover, with free layer 14 formed to have a circular planar shape with a diameter of 1.2 μm and insulating intermediate layer 13 formed to have substantially the same planar shape as that of free layer 14, pinned layer 12 was formed to have a square planar shape that was 2 μm in both width and length (the aspect ratio is 1:1; see FIG. 8A), and an angular error resulting from this planar shape was determined. Furthermore, pinned layer 12 was formed to have a rectangular planar shape that was 2 μm in width and 4 μm in length (the aspect ratio is 2:1; see FIG. 8B), and an angular error resulting from this planar shape was determined. Moreover, pinned layer 12 was formed to have a rectangular planar shape that was 2 μm in width and 6 μm in length (the aspect ratio is 3:1; see FIG. 8C), and an angular error resulting from this planar shape was determined. Furthermore, pinned layer 12 was formed to have a rectangular planar shape that was 2 μm in width and 10 μm in length (the aspect ratio is 5:1; see FIG. 8D), and an angular error resulting from this planar shape was determined. The determined angular errors were plotted as triangular dots as shown in FIG. 4. In this case, the ratio of the diameter of free layer 14 to the width of pinned layer 12 is 1.2 to 2, that is, 1 to about 1.67.

In all of the above-described examples and examples described below, the longitudinal direction of pinned layer 12 was parallel to and the same as or opposite to the magnetization direction in pinned layer 12. Thus, there is 90° of rotation between the longitudinal direction of pinned layer 12 in each of MR elements 6 in Wheatstone bridge 3a and the longitudinal direction of pinned layer 12 in each of MR elements 6 in Wheatstone bridge 3b.

The results shown in FIG. 4 indicate that the angular error tends to decrease as pinned layer 12 is more and more elongate. As shown in FIG. 6A to FIG. 8D, pinned layer 12 is larger than free layer 14 and sticks out from free layer 14. The sticking-out portion does not contribute to the tunnel effect but to a reduction in angular error as is apparent from FIG. 4. This may be partly because the magnetization direction in pinned layer 12 extending along the longitudinal direction thereof cannot be easily rotated so as to align with the direction of the small width of pinned layer 12 orthogonal to the longitudinal direction. Then, it is expected that it will become more and more difficult to rotate the magnetization direction as the ratio of the length in the longitudinal direction, which is parallel to the magnetization direction, to the length in the width direction, which is orthogonal to the longitudinal direction, increases. FIG. 4 clearly indicates that with the width of pinned layer 12 unchanged, the angular error decreases with increasing length in the longitudinal direction, and clearly indicates that with the length of pinned layer 12 in the longitudinal direction thereof unchanged, the angular error decreases with decreasing length thereof in the width direction thereof. In particular, it can be seen that the angular error is relatively small when the length of pinned layer 12 in the longitudinal direction thereof, which extends along the fixed magnetization direction in pinned layer 12, is at least three times as large as the length thereof in the direction (width direction) orthogonal to the fixed magnetization direction.

Now, free layer 14 will be discussed. Contrary to pinned layer 12, it is preferable that the magnetization direction of free layer 14 is easily moved (rotated) under the effect of external magnetic fields. Then, it can be seen that when free layer 14 is formed to have a square planar shape, and more preferably a circular shape, instead of a rectangular shape, the magnetization direction is likely to rotate freely in any direction under the effect of external magnetic field 19. Thus, it can be seen that the following configuration is effective for reducing the angular error. Pinned layer 12 is formed to have a planer shape whose forms are as elongate as possible to make the magnetization direction difficult to rotate, Free layer 14 is formed to have a square or a circular (or elliptical) planar shape to allow the magnetization direction to rotate easily.

Figures 6A, 6B, 6C:
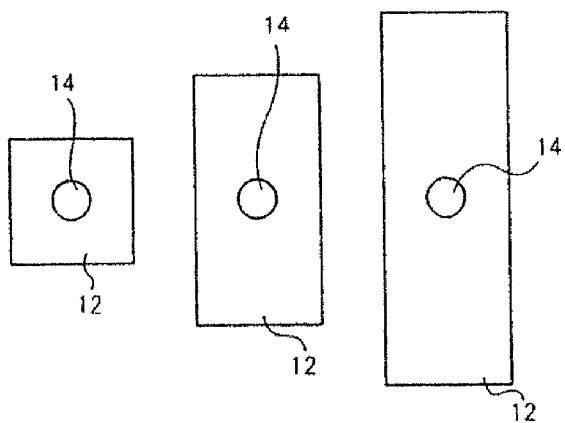
FIG. 6A to FIG. 6C are plan views showing other examples of the shapes of the pinned layer and free layer in the MR element included in the sensing circuit in the sensor.
Figure 7A:
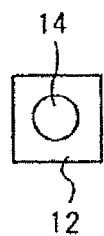
FIG. 7A to FIG. 7C are plan views showing yet other examples of the shapes of the pinned layer and free layer in the MR element included in the sensing circuit in the sensor.
Figure 7B:
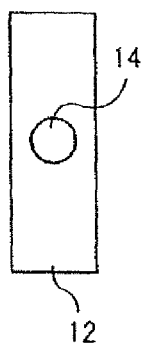
Figure 7C:
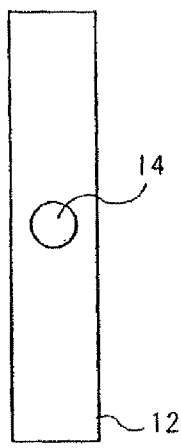
Figure 8A:
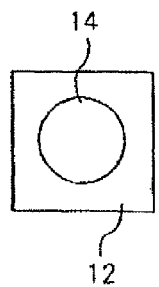
FIG. 8A to FIG. 8D are plan views showing still other examples of the shapes of the pinned layer and free layer in the MR element included in the sensing circuit in the sensor.
Figure 8B:
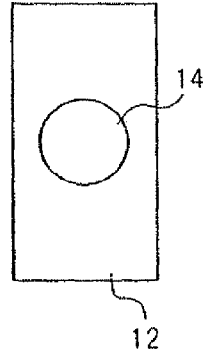
Figure 8C:
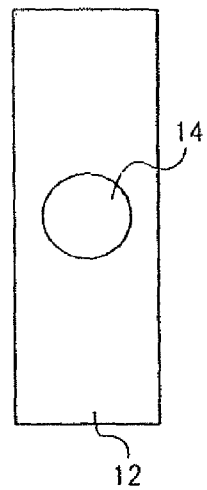
Figure 8D:
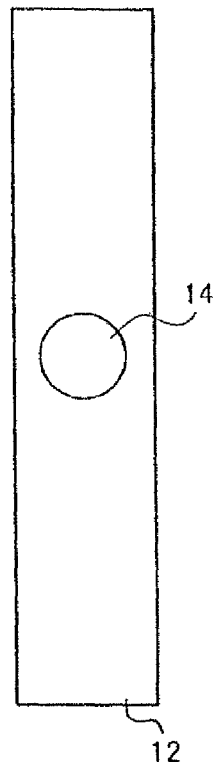

Furthermore, a comparison among the rhombic dots, rectangular dots, and triangular dots in FIG. 4 indicates that with the diameter of free layer 14 unchanged, the angular error tends to decrease consistently with the width of pinned layer 12 and that with the width of pinned layer 12 unchanged, the angular error tends to decrease with increasing diameter of free layer 14. Thus, measurements were carried out to confirm the above-described points. Specifically, as shown in FIG. 6C, free layer 14 was formed to have a circular planar shape with a diameter of 0.6 μm, and pinned layer 12 was formed to have a rectangular planar shape that was 2 μm in width and 6 μm in length (the aspect ratio is 3:1). Then, the relationship between external magnetic field 19 and an angular error resulting from this planar shape was determined as shown by a solid line in FIG. 9. Then, as shown in FIG. 10, free layer 14 was formed to have a circular planar shape with a diameter of 5 μm, and pinned layer 12 was formed to have a rectangular planar shape that was 2 μm in width and 6 μm in length (the aspect ratio is 3:1). Then, the relationship between external magnetic field 19 and an angular error resulting from this planar shape was determined as shown by an alternate long and two short dashes line in FIG. 9. A comparison between the solid line and the alternate long and two short dashes line indicates that with the planar shape of pinned layer 12 unchanged, the angular error decreases with the increasing size of the planar shape of free layer 14. This tendency is prominent particularly if the intensity of external magnetic field 19 is not particularly high or low but is moderate.

Figure 11:
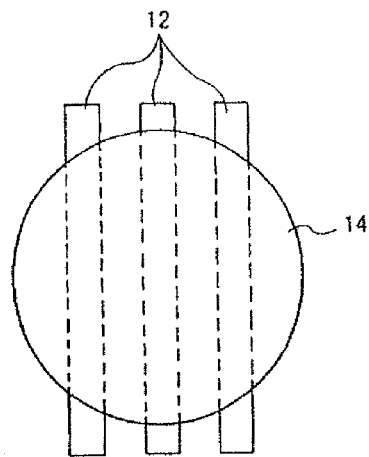
FIG. 11 is a plan view showing still further another example of the shapes of the pinned layer and free layer in the MR element included in the sensing circuit in the sensor.

Moreover, as shown in FIG. 11, free layer 14 was formed to have a circular planar shape with a diameter of 5 μm, and pinned layer 12 was formed by dividing a rectangle that was 2 μm in width and 6 μm in length (the aspect ratio is 3:1) into three sections in the width direction thereof, that is, pinned layer 12 included three rectangles arranged in the width direction and each of which was about 0.67 μm in width and 6 μm in length. Then, the relationship between external magnetic field 19 and an angular error resulting from this planar shape was determined as shown by a dotted line in FIG. 9. The area between the three sections of pinned layer 12 was filled with an insulating layer.

Figure 9:
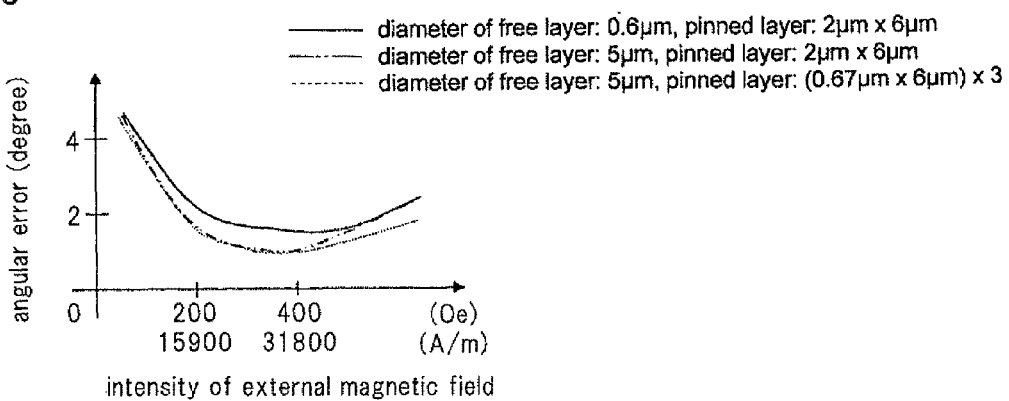
FIG. 9 is a graph showing the relationship between the angular error and the intensity of external magnetic fields in the sensor.
Figure 10:
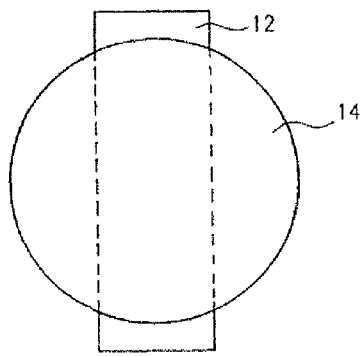
FIG. 10 is a plan view showing further another example of the shapes of the pinned layer and free layer in the MR element included in the sensing circuit in the sensor.

A comparison between the dotted line and alternate long and two short dashes line in FIG. 9 indicates that with the planar shape of free layer 14 unchanged and the total planar area of pinned layer 12 unchanged, the angular error is smaller when the planar shape of pinned layer 12 is formed of a plurality of sections obtained by dividing a rectangle in the width direction than when the planar shape of pinned layer 12 is formed of the single rectangle. This tendency is prominent particularly when external magnetic field 19 has a relatively high intensity. When pinned layer 12 has a planar shape in which pinned layer 12 is divided into a plurality of sections in the width direction thereof, particularly if the external magnetic field 19 has a relatively high intensity, the variation in angular error, which depends on the intensity of the external magnetic field, tends to decrease. Thus, this planar shape can be used for a wide range of external magnetic fields. Furthermore, the planar shape allows the error to be easily corrected. Additionally, in the example shown in FIGS. 10 and 11, free layer 14 has a relatively large area and thus the free layer 14 has a reaction which is sensitively to external magnetic field 19. This increases the sensing accuracy.

In the present embodiment, TMR elements are used as MR elements 6. Thus, pinned layer 12 may be completely separated in the width direction thereof. If GMR elements are used as MR elements 6, the separated rectangular sections are desirably coupled together at a certain portion of each section for electric conductivity. In this case, the coupled portion need not overlap free layer 14 but may be coupled at a position separate from free layer 14.

In the above description, MR element 6 is placed on each side of the rectangle of each of Wheatstone bridges 3a and 3b in the circuitry design shown in FIG. 2. However, although not shown in the drawings, a group of plurality of MR elements 6 connected together in series may be placed on each side. In this case, each element group may be treated equivalent to one MR element 6 for sensing. A reduced voltage is applied to each individual MR element 6. This reduces the possibility of destruction caused by overcurrent. Furthermore, variations in characteristics among MR elements 6 can advantageously be averaged to reduce the error.

As described in detail with reference to the specific examples, the present invention increases reliability as follows. When pinned layer 12 has an elongate planar shape and particularly when the longitudinal direction of the pinned layer is parallel to the fixed magnetization direction therein, the pinned layer is prevented from being affected by external magnetic field 19, thus avoiding movement of the magnetization direction. Moreover, the angular error decreases with increasing ratio (aspect ratio) of the length of pinned layer 12 in the longitudinal direction thereof to the length of the pinned layer 12 in the width direction thereof, which is orthogonal to the longitudinal direction. That is, the length in the longitudinal direction is preferably as large as possible. The length in the width direction is preferably as small as possible. Furthermore, with the total area of pinned layer 12 unchanged, an elongate shape (for example, a rectangle or an ellipse) divided into a plurality of sections is more preferable than the single elongate shape (for example, a rectangle or an ellipse).

On the other hand, when free layer 14 has a circular planar shape and a large area, the magnetization direction in free layer 14 can be freely and easily rotated to any direction and any angle. Thus, the magnetization direction can have a reaction which is sensitive to external magnetic field 19, which causes an increase in sensing accuracy. Specifically, if free layer 14 has an elliptical planar shape or the like, the total area of free layer 14 as seen in a plan view is preferably larger than the area of the portion of pinned layer 12 which overlaps free layer 14 as seen in a plan view. Moreover, preferably, free layer 14 has a circular planar shape and has a larger total area than pinned layer 12 as seen in a plan view.

The sensor including MR elements 6 according to the present invention can be used not only to sense the angle of rotation of a steering wheel in a vehicle as shown in FIG. 1 but also to sense the position and angle of any sense target member.

While preferred embodiments of the present invention have been described using specific terms, such description is for illustrative purposes only, and it is to be understood that changes and variations may be made without departing from the spirit or scope of the following claims.

What is claimed is:

1. A magneto-resistance effect element, comprising:
a stack of layers comprising a pinned layer, a free layer, and an intermediate layer between the pinned layer and the free layer;
the pinned layer having:
a length direction, a width direction, and a thickness direction, the thickness direction being in a direction of stacking of the stack of layers, the length and width directions being perpendicular to each other and defining a plane that is orthogonal to the thickness direction;

a fixed magnetization direction that is orthogonal to the thickness direction of the pinned layer and parallel to the length direction of the pinned layer; and a planar shape in the plane defined by the length and width directions of the pinned layer, the planar shape being longer in the length direction than in the width direction of the pinned layer; and the free layer having:

a length direction, a width direction, and a thickness direction, the thickness direction being in a direction of stacking of the stack of layers, the length and width directions being a perpendicular to each other and defining a plane that is orthogonal to the thickness direction;

a circular planar shape or an elliptical planar shape within the plane defined by the length and width directions of the free layer; and a magnetization direction which varies in response to an external magnetic field;

wherein:

the pinned layer is divided into a plurality of sections within the plane defined by the length and width directions of the pinned layer, each section being longer in the length direction than in the width direction of the pinned layer.

2. The magneto-resistance effect element according to claim 1, wherein the planar shape of the pinned layer has a length in the length direction of the pinned layer that is at least three times as large as a length in the width direction of the pinned layer.

3. The magneto-resistance effect element according to claim 1, wherein the free layer has a circular planar shape.

4. The magneto-resistance effect element according to claim 1, wherein a total area of the free layer in the plane defined by the length and width directions of the free layer is larger than an area of a portion of the pinned layer in the plane defined by the length and width directions of the pinned layer that overlaps the free layer as seen in a plan view looking along the direction of stacking of the stack of layers.

5. The magneto-resistance effect element according to claim 4, wherein a total area of the free layer in the plane defined by the length and width directions of the free layer is larger than an area of the pinned layer in the plane defined by the length and width directions of the pinned layer.

6. The magneto-resistance effect element according to claim 1, wherein the intermediate layer is an insulating layer or a nonmagnetic layer or an insulating and nonmagnetic layer.

7. A sensor comprising:

a sensing circuit comprising a Wheatstone bridge having a plurality of the magneto-resistance effect elements according to claim 1 connected to each other, and a magnet provided at a position opposite to the sensing circuit, wherein the sensor is configured to sense a variation in a positional relationship between the magnet and the sensing circuit by sensing a variation in a resistance value of each of the magneto-resistance effect elements resulting from a variation in a magnetic force exerted by the magnet on the free layer of each of the magneto-resistance effect elements.

8. The sensor according to claim 7, wherein the magnet is mounted on a sense target member and the sensing circuit is fixed at a position opposite to the magnet, the sensor being further configured to sense a variation in the angle of the sense target member by sensing a variation in the resistance value of each of the magneto-resistance effect elements.

9. A magneto-resistance effect element, comprising:

a stack of layers comprising a pinned layer, a free layer, and an intermediate layer between the pinned layer and the free layer;

the pinned layer having:

a length direction, a width direction, and a thickness direction, the thickness direction being in a direction of stacking of the stack of layers, the length and width directions being perpendicular to each other and defining a plane that is orthogonal to the thickness direction;

a fixed magnetization direction that is orthogonal to the thickness direction of the pinned layer and parallel to the length direction of the pinned layer; and a planar shape in the plane defined by the length and width directions of the pinned layer the planar shape being longer in the length direction than in the width direction of the pinned layer; and the free layer having:

a length direction, a width direction, and a thickness direction, the thickness direction being in a direction of stacking of the stack of layers, the length and width directions being perpendicular to each other and defining a plane that is orthogonal to the thickness direction;

a circular planar shape or an elliptical planar shape within the plane defined by the length and width directions of the free layer; and a magnetization direction which varies in response to an external magnetic field;

wherein:

the pinned layer is divided into a plurality of sections within the plane defined by the length and width directions of the pinned layer, each section being longer in the length direction than in the width direction of the pinned layer;

an area between the sections of the pinned layer is filled with an insulating layer; and a total area of the free layer in the plane defined by the length and width directions of the free layer is larger than an area of the pinned layer in the plane defined by the length and width directions of the pinned layer.

10. The magneto-resistance effect element according to claim 9, wherein the planar shape of the pinned layer has a length in the length direction of the pinned layer that is at least three times as large as a length in the width direction of the pinned layer.

11. The magneto-resistance effect element according to claim 9, wherein the free layer has a circular planar shape.

12. The magneto-resistance effect element according to claim 9, wherein a total area of the free layer in the plane defined by the length and width directions of the free layer is larger than an area of a portion of the pinned layer in the plane defined by the length and width directions of the pinned layer that overlaps the free layer as seen in a plan view looking along the direction of stacking of the stack of layers.

13. The magneto-resistance effect element according to claim 9, wherein the intermediate layer is an insulating layer or a nonmagnetic layer or an insulating and nonmagnetic layer.

14. A sensor comprising:

a sensing circuit comprising a Wheatstone bridge having a plurality of the magneto-resistance effect elements according to claim 9 connected to each other, and a magnet provided at a position opposite to the sensing circuit, wherein the sensor is configured to sense a variation in a positional relationship between the magnet and the sensing circuit by sensing a variation in a resistance value of each of the magneto-resistance effect elements resulting from a variation in a magnetic force exerted by the magnet on the free layer of each of the magneto-resistance effect elements.

15. The sensor according to claim 14, wherein the magnet is mounted on a sense target member and the sensing circuit is fixed at a position opposite to the magnet, the sensor being further configured to sense a variation in the angle of the sense target member by sensing a variation in the resistance value of each of the magneto-resistance effect elements.

* * * * *